(12) United States Patent  
Terada et al.

(10) Patent No.: US 7,926,444 B2  
(45) Date of Patent: Apr. 19, 2011

(54) METHOD FOR FORMING THIN FILM AND FILM-FORMING DEVICE

(75) Inventors: Shouichi Terada, Koshi (JP); Tsuyoshi Mizuno, Koshi (JP); Takeshi Uehara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1126 days.

(21) Appl. No.: 11/585,863

(22) Filed: Oct. 25, 2006

(65) Prior Publication Data

US 2007/0116881 A1    May 24, 2007

(30) Foreign Application Priority Data

Nov. 21, 2005 (JP) .................................. 2005-335247

(51) Int. Cl.
*B05B 5/025* (2006.01)
*B05C 11/02* (2006.01)

(52) U.S. Cl. .......... 118/629; 118/634; 118/52; 118/612; 118/319; 118/320

(58) Field of Classification Search .......... 118/620–640, 118/52, 612, 319, 320, 715–733; 396/604, 396/610, 627; 134/153, 198, 902; 427/458, 427/472, 481
See application file for complete search history.

(56) References Cited

U.S. PATENT DOCUMENTS 5,942,035 A * 8/1999 Hasebe et al. .................. 118/52
6,239,038 B1 * 5/2001 Wen ............................... 438/745
7,247,272 B1   7/2007 Moerman et al.

FOREIGN PATENT DOCUMENTS

| JP | 58-17864 | 2/1983 |
|---|---|---|
| JP | 1-99473 | 7/1989 |
| JP | 9-234396 | 9/1997 |
| JP | 2000-15147 | 1/2000 |
| JP | 2001-242722 | 9/2001 |
| JP | 2001-286814 | 10/2001 |
| JP | 2002-532230 | 10/2002 |
| JP | 2004-64007 | 2/2004 |
| JP | 2004-160287 | 6/2004 |
| JP | 2005-13787 | 1/2005 |
| JP | 2005-262127 | 9/2005 |

OTHER PUBLICATIONS

Notice of Grounds of Rejection mailed on Dec. 4, 2009 for priority Japanese Patent Application No. 2005-335247 with English translation.

* cited by examiner

*Primary Examiner* — Yewebdar T Tadesse
(74) *Attorney, Agent, or Firm* — Smith, Gambrell & Russell, LLP

(57) ABSTRACT

It is an object to provide a method for forming a thin film having a uniform thickness so as to follow asperities of a surface of a wafer to be processed and to provide a film-forming device used for the method. The film-forming device includes a treatment chamber for receiving a wafer and isolating the wafer from the air; a solvent-gas-supplying portion for supplying a solvent gas into the treatment chamber; a chuck for rotatably holding the wafer so that the downward-facing surface of the substrate is the surface on which a thin film is formed; a coating-solution-supplying portion for supplying a coating solution as a mist of charged particles toward the surface of the wafer; and a charging portion for charging the wafer with an electrical potential opposite to the charge of the particles.

4 Claims, 3 Drawing Sheets

METHOD FOR FORMING THIN FILM AND FILM-FORMING DEVICE

BACKGROUND OF THE INVENTION

1. Field of the Invention

The present invention relates to a method for uniformly forming a thin film on a substrate surface having asperities thereon and further relates to a device used for the method.

2. Description of the Background Art

In general, in manufacturing processes of semiconductor wafers, photolithography technology is used for forming resist patterns on surfaces of substrates (substrates to be processed) such as semiconductor wafers or LCD substrates. This photolithography technology includes a resist-applying step for applying a resist solution to a surface of a substrate to be processed, an exposure treatment step for exposing the resulting resist film to a circuit pattern, and a development treatment step for supplying a developing solution to the substrate after the exposure treatment step. In such a case, the resist-applying step employs a so-called spin-coating method, namely, placing a substrate on a rotatable mounting platform so that the upward-facing surface of the substrate is the face (surface) to be processed, and supplying (dropping or discharging) a resist solution to the surface of the substrate while rotating the substrate. A film of the resist solution is formed on the surface of the substrate by centrifugal force.

In addition, as the related art, electrostatic coating utilizing the principle of electrospray is known (see, for example, Japanese Patent Laying-Open No. 2001-286814).

However, since a resist film is formed on a substrate surface by centrifugal force in the spin-coating method, the resist film tends to have a thickness increasing toward the periphery of the substrate. Therefore, uniformity in the film thickness of the substrate surface is lost. If nonuniformity occurs in the film thickness, later processes are disadvantageously influenced. For example, in an etching process, depth of etching differs depending on the area of the surface. Thus, various problems arise.

SUMMARY OF THE INVENTION

The present invention has been accomplished in view of the aforementioned circumstances. It is an object of the present invention to provide a method for forming a thin film, such as a resist film, having uniform thickness so as to follow asperities of a substrate surface to be processed and to provide a device used for the method.

In order to achieve the above-mentioned object, in a method for forming a thin film according to the present invention, a thin film is formed on a substrate having asperities on a surface thereof by supplying a coating solution to the surface of the substrate. The method includes the steps of conveying the substrate into a treatment chamber isolated from the air so that the downward-facing surface of the substrate is the surface to be processed; substituting the atmosphere in the treatment chamber with a solvent gas atmosphere; and spraying charged particles of a coating solution toward the surface of the substrate while rotating the substrate in the horizontal direction and, simultaneously, charging the substrate with an electrical potential opposite to the charge of the particles and thereby electrostatically adhering the coating solution to the surface of the substrate.

Preferably, the method for forming a thin film according to the present invention further includes the step of exhausting the solvent gas from the treatment chamber after the formation of the thin film by adhering the coating solution to the surface of the substrate.

Preferably, the method for forming a thin film according to the present invention further includes the step of stabilizing the film properties of the thin film by heating the substrate after the formation of the thin film on the surface of the substrate.

A film-forming device according to the present invention is used for forming a thin film on a substrate having asperities on a surface thereof by supplying a coating solution to the surface of the substrate. The film-forming device includes a treatment chamber for receiving the substrate and isolating the substrate from the air; a solvent-gas-supplying portion for supplying a solvent gas into the treatment chamber; a holding portion for rotatably holding the substrate so that the downward-facing surface of the substrate is the surface to be processed, the holding portion being provided in the treatment chamber; a coating-solution-supplying portion for supplying a coating solution as a mist of charged particles toward the surface of the substrate, the coating-solution-supplying portion being disposed in the treatment chamber; and a charging portion for charging the substrate with an electrical potential opposite to the charge of the particles.

Preferably, the film-forming device according to the present invention further includes an exhausting portion for exhausting the solvent gas from the treatment chamber. In addition, one of or both the holding portion and the coating-solution-supplying portion are preferably constituted so that the relative distance between the holding portion and the coating-solution-supplying portion can be changed.

According to the present invention, the following effects can be achieved.

(1) Since the coating solution is sprayed toward the bottom face of the substrate from the lower side of the substrate, particles having large particle sizes cannot reach the surface of the substrate due to gravity and only particles having particle sizes less than a predetermined size can be electrostatically adhered to the surface of the substrate. Therefore, particles having particle sizes in a narrow range, namely, particles having a uniform particle size, are adhered to the substrate and thereby a thin film having a uniform thickness can be formed so as to follow the asperities on the surface, compared with a thin film formed by spraying a coating solution from the upper side of the substrate in electrostatic coating technology.

In addition, in the present invention, charged particles of the coating solution are electrostatically adhered to the substrate charged with an electrical potential opposite to the charge of the particles by electrical attraction. Therefore, the adhered state of the particles lasts for a long time, and later treatment of the substrate can be readily performed. Furthermore, in the present invention, the spraying of the coating solution is conducted in a treatment chamber which is isolated from the air and is maintained with a solvent gas atmosphere. Therefore, drying of the coating solution is avoided, and the fluidity of the sprayed coating solution is prevented. Additionally, directions that the charged particles are electrostatically moved are not influenced by the air.

(2) Exhaustion of the solvent gas from the treatment chamber is not conducted during the formation of a thin film but is conducted after the formation of the thin film. Therefore, the fluidity of the coating solution during the treatment for forming the film can be prevented and, thereby, uniformity in the thickness of the thin film is further achieved, in addition to the effects described in the above (1).

(3) Since the substrate is heated after the formation of a thin film, the film properties of the thin film can be stabilized. Therefore, the thin film can be surely formed, in addition to the effects described in the above (1) and (2).

(4) Since the distance between the substrate held by the holding portion and the coating-solution-supplying portion can be properly adjusted, the coating solution can be sprayed in a further optimal state, in addition to the effects described in the above (1).

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The preferred embodiments of the present invention will now be described with reference to the appended drawings.

Figure 1:
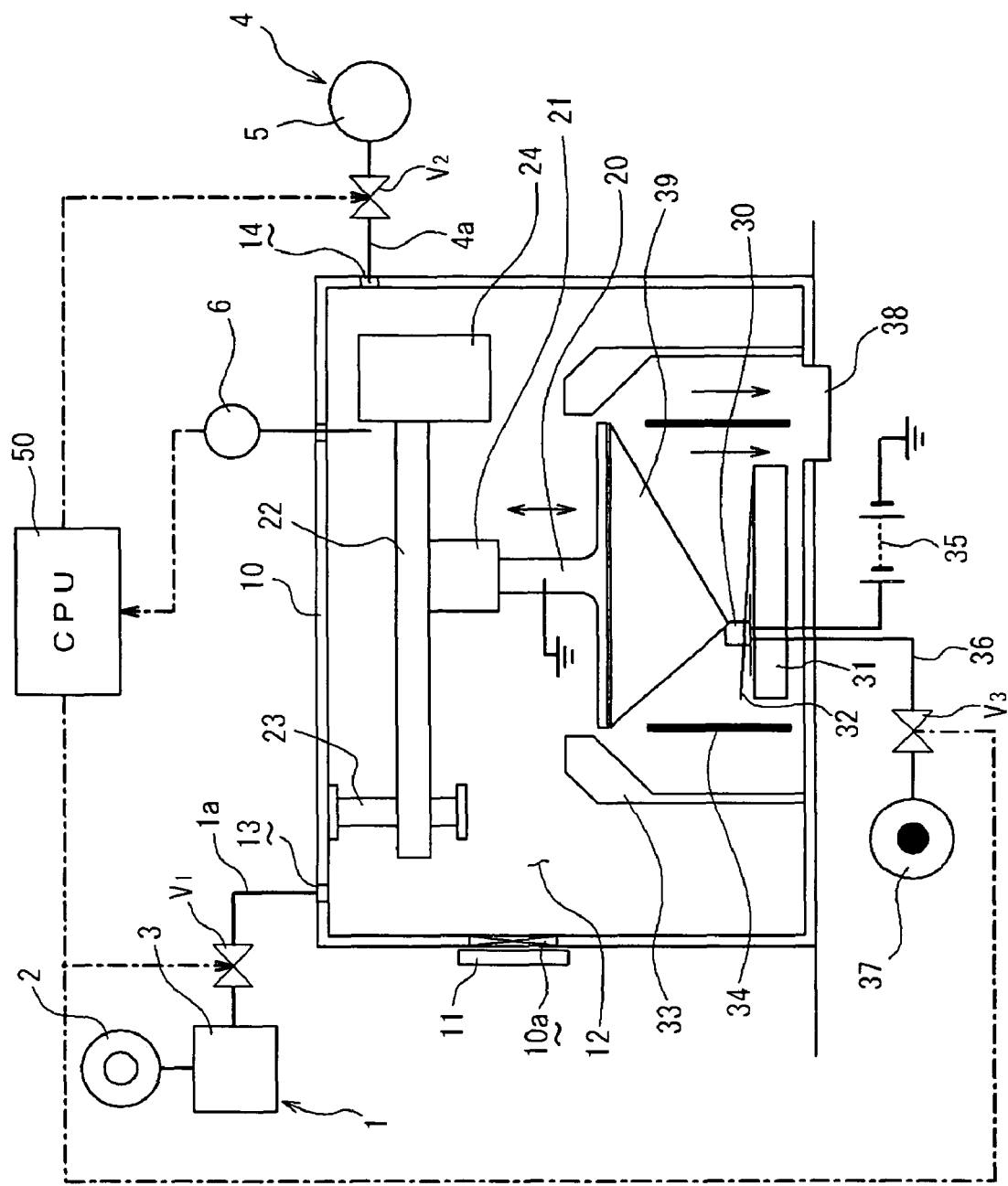
FIG. 1 is a schematic cross-sectional view of a film-forming device according to an embodiment of the present invention.

FIG. 1 is a resist-coating device as an example of the film-forming device for forming a thin film according to an embodiment of the present invention.

As shown in FIG. 1, the resist-coating device includes a housing 10 to form a treatment chamber 12 which can be isolated from the air. The housing 10 is provided with an opening 10a for taking a wafer W in and out. The opening 10a is opened and closed by a shutter 11 which is driven by a lifting and lowering portion (not shown) so as to move up and down. The inside of the housing 10 is provided with a chuck 20 serving as a holding portion for holding a semiconductor wafer W (hereinafter referred to as a wafer W) as a substrate to be processed, a motor 21 serving as a rotating portion for rotating the chuck 20, and a supporting member 22 for supporting the chuck 20 and the motor 21 at the upper side thereof. The chuck 10 holds the wafer W horizontally face down by utilizing vacuum adsorptive forces so that the downward-facing surface of the wafer W is the surface to be processed.

A resist-solution-supplying nozzle 30 is disposed on the lower portion inside the housing 10. The resist-solution-supplying nozzle 30 serves as a coating-solution-supplying portion and supplies a coating solution as a mist of charged particles toward the surface of the wafer W held by the chuck 20. The particle mist is sprayed in a direction oblique rather than perpendicular to the horizontally-held wafer W held on chuck 20. The resist-solution-supplying nozzle 30 is fixed on a mounting platform 31 which is driven by a lifting and lowering portion (not shown) so as to move up and down. The mounting platform 31 is proved with a tilted plate 32 so that dropped coating solution flows laterally.

In addition, a treatment cup 33 is disposed so as to surround the resist-solution-supplying nozzle 30 and the chuck 20. The resist-solution-supplying nozzle 30 and the chuck 20 are positioned near the opening at the upper portion of the treatment cup 33. Therefore, a cylindrical spraying chamber is formed by this treatment cup 33, the chuck 20, and the wafer W, and the resist-solution-supplying nozzle 30 is positioned at the base of this cylindrical spraying chamber. Furthermore, a cylindrical antistatic plate 34 made of an insulating material is disposed along the internal face of the treatment cup 33 so as to be concentric to the treatment cup 33. The antistatic plate 34 prevents the sprayed coating solution from migrating toward the treatment cup 33.

A direct-current voltage 35 is applied between the chuck 20 and the resist-solution-supplying nozzle 30 in order to apply an electric charge to the coating solution particles to be sprayed and to charge the wafer W with an electrical potential opposite to the charge of the particles. In this embodiment, the coating solution particles to be sprayed are positively charged and thereby are attracted toward the wafer W which is grounded via chuck 20 and is charged to a negative potential. Thus, a bias relationship is established. Instead of the bias of the direct-current voltage, a pulsating direct-current voltage generated by superposing an alternating current on a direct current may be applied.

Furthermore, the inside of the housing 10 is provided with a lifting and lowering portion 24 for allowing the chuck 20 and the motor 21 which are suspended from the supporting member 22 to vertically move. The lifting and lowering portion 24 changes a relative distance between the chuck 20 and the nozzle 30 serving as the coating-solution-supplying portion.

The lifting and lowering portion 24 is mounted on one end of the supporting member 22 and may be composed of a ball screw mechanism including a lifting motor for vertically driving the supporting member 22 together with the chuck 20 and the motor 21. The other end of the supporting member 22 is slidably fit to a guide bar 23 being suspended from the ceiling of the housing 10. In the thus constituted lifting and lowering portion 24, the chuck 20 and the motor 21 are transferred to a predetermined position inside the treatment cup 33 or to another predetermined position upper side of the treatment cup 33 by rotating the lifting motor in forward or reverse direction.

The treatment chamber 12 receiving the wafer W and isolating the wafer W from the air is connected to a solvent-gas-supplying portion 1 for supplying a solvent gas into the treatment chamber 12 and an exhaust portion 4. The solvent gas prevents drying of the sprayed coating solution and suppresses fluidity of the coating solution. In this embodiment, the solvent-gas-supplying portion 1 is composed of a solvent source 2 and a vaporizer 3 for generating solvent gas. The solvent source 2 is connected to the vaporizer 3 via a supply pipe 1a and the vaporizer 3 is further connected to a supply port 13 disposed at one side end of the housing 10 via a supply pipe 1a, namely, the solvent source 2 and the supply port 13 are connected via the supply pipe 1a so as to have the vaporizer 3 therebetween. In addition, the supply pipe 1a is provided with an on-off valve V1 the opening degree of which is controllable. The on-off valve V1 is opened and closed according to a control signal from a controller 50 described below.

The exhaust portion 4 is provided with a vacuum pump 5 being connected to an exhaust port 14 via an exhaust pipe 4a. The exhaust port 14 is disposed to the housing 10 at the side end other than the side end where the supply port 13 is disposed. In addition, the exhaust pipe 4a is provided with a butterfly valve V2 the opening degree of which is controllable. The butterfly valve V2 is opened and closed according to a control signal from the controller 50 described below.

The controller 50 is formed of, for example, a central processing unit (CPU) and transmits a control signal to the on-off valve V1 of the solvent-gas-supplying portion 1 and the butterfly valve V2 of the exhaust portion 4 on the basis of a detection signal from a pressure gauge 6 for detecting concentration of the solvent gas in the treatment chamber 12.

The resist-solution-supplying nozzle 30 is connected to a resist reservoir 37 for supplying a coating solution via a coating-solution-supplying pipe 36. The coating-solution-supplying pipe 36 is provided with an on-off valve V3 the opening degree of which is controllable. The on-off valve V3 is opened and closed according to a control signal from the controller 50.

Figure 2:
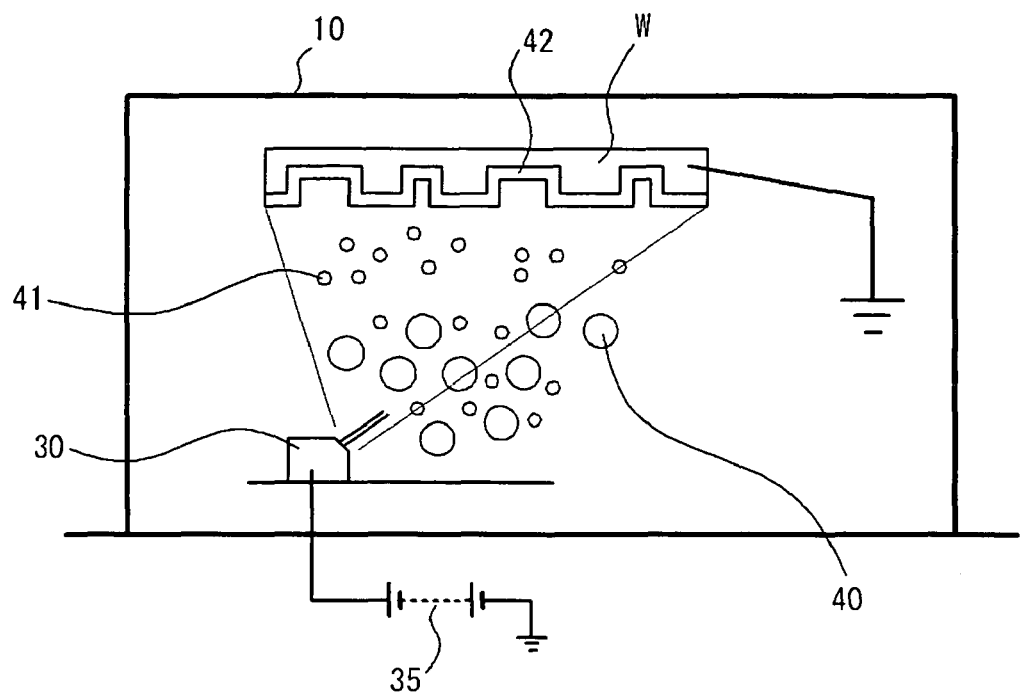
FIG. 2 is an enlarged cross-sectional view of a main part of a thin film formed by the film-forming device according to an embodiment of the present invention.
Figure 3:
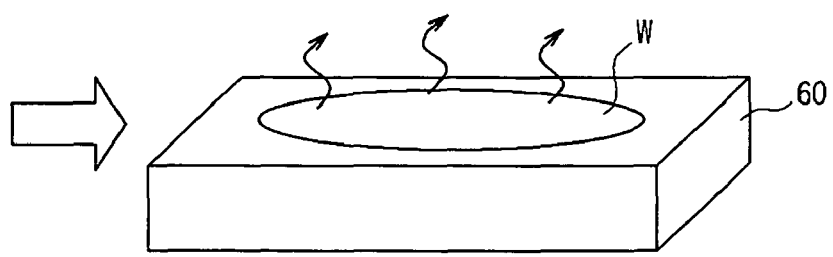
FIG. 3 is a schematic perspective view showing a state where the film properties of a thin film are stabilized by heating the substrate after the formation of the thin film in the method for forming a thin film according to an embodiment of the present invention.
Figure 4:
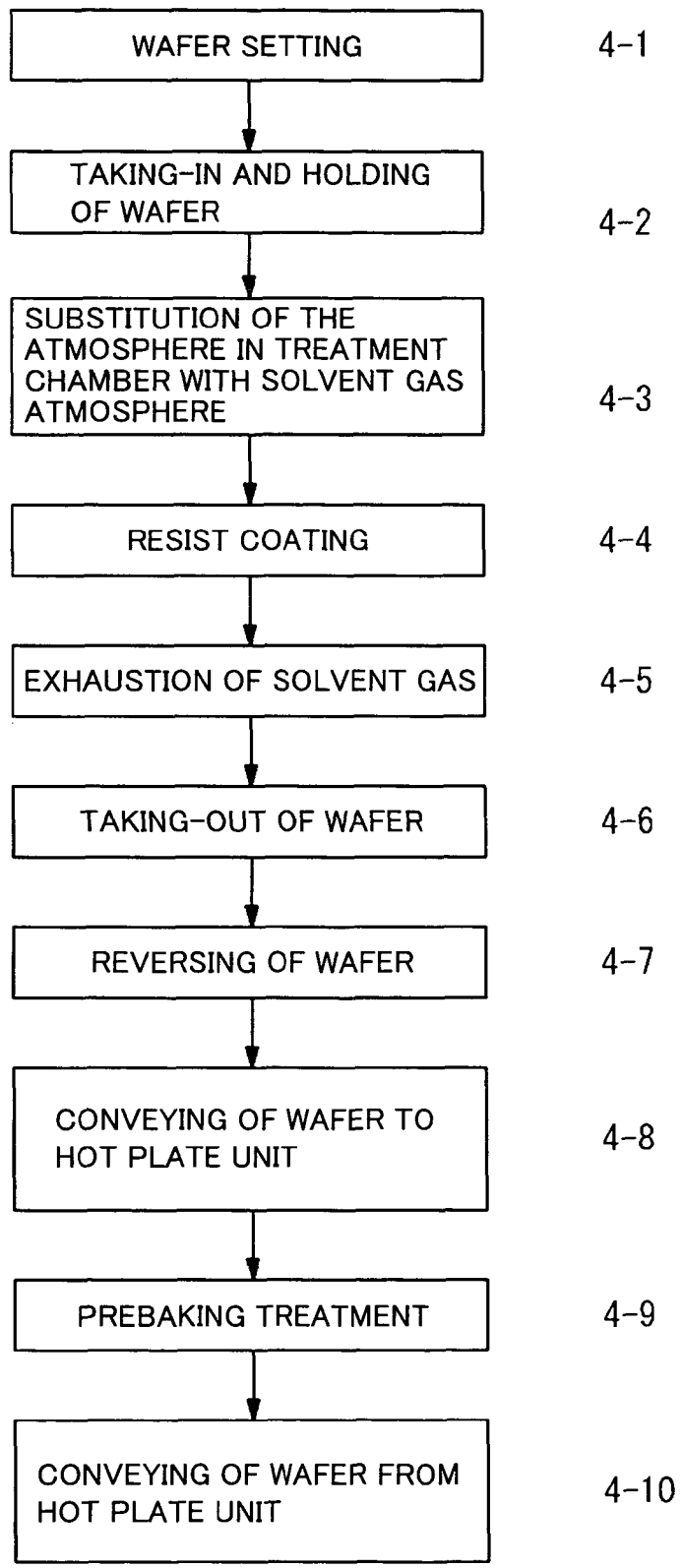
FIG. 4 is a flow chart showing the operation of the film-forming device according to an embodiment of the present invention.

The operation of the resist-coating device having the above-mentioned configuration will now be described with reference to the drawings of FIGS. 1 to 3 and the flow chart of FIG. 4.

First, a wafer W is set so that the downward-facing surface of the wafer W is the surface to be processed by a reversing mechanism which is not shown in the drawing (Step 4-1). The wafer W in this state is conveyed to the resist-coating device by a conveying arm (not shown) and is adsorptively held by the chuck 20 (Step 4-2). A solvent supplied from the solvent source 2 is gasified by the vaporizer 3. The solvent gas is introduced into the treatment chamber 12 by opening the on-off valve V1, and the atmosphere in the treatment chamber 12 is substituted with the solvent gas atmosphere (Step 4-3). On this occasion, the butterfly valve V2 of the exhaust portion 4 is closed.

Then, the wafer W is horizontally rotated together with the chuck 20. A direct-current voltage 35 is applied between the chuck 20 and the resist-solution-supplying nozzle 30 and, to the thus formed electric field, positively charged particles of a resist solution 39 are sprayed obliquely with respect to the downward-facing surface of wafer W, from the resist-solution-supplying nozzle 30 (Step 4-4). On this occasion, as shown in FIG. 2, the distance between the wafer W and the resist-solution-supplying nozzle 30 is properly adjusted previously so that the resist solution particles 40 having large particle sizes fall downward due to gravity and only the resist solution particles having particle sizes less than a predetermined particle size reach the wafer W. The distance between the wafer W and the resist-solution-supplying nozzle 30 is adjusted by changing the wafer W position in the height direction by the lifting and lowering portion 24 or changing the position of the mounting platform 31 which is vertically movable. In addition, the direct-current voltage 35 to be applied is also previously set to a proper value which is determined in the relation with the distance between the wafer W and the resist-solution-supplying nozzle 30.

Under such conditions, the positively charged resist solution particles sprayed as a mist are attracted to the wafer W by an electric field and are adhered to the surface of the wafer W by electrostatic forces. On this occasion, as shown in FIG. 2, the large particles 40 of the resist solution fall downward due to gravity. Therefore, only the small particles 41 having particle sizes in a narrow range can be electrostatically adhered to the surface of the wafer W. Consequently, a thin film 42 having a uniform thickness can be formed on the wafer W so as to follow asperities of the surface.

The resist solution falling to the tilted plate 32 as the large particles 40 flows downward from the tilted plate 32 and are collected from a drain 38 disposed at the lower portion in the treatment chamber 12. Furthermore, the antistatic plate 34 prevents the resist solution particles from migrating toward the internal wall surface of the treatment cup 33 and from adhering to the internal wall surface of the treatment cup 33.

After the completion of the coating of the resist solution, the butterfly valve V2 is opened and the solvent gas is exhausted by the vacuum pump 5 (Step 4-5). This suppresses fluidity of the resist film applied to the wafer W. Then, the wafer W is taken out from the resist-coating device (Step 4-6) by a main wafer-conveying mechanism (not shown) and the wafer W is reversed by a reversing mechanism so that the upward-facing surface of the wafer W is the treated surface (Step 4-7). Then, the wafer W is conveyed into a hot plate unit which is not shown in the drawing (Step 4-8), and, as shown in FIG. 3, the wafer W is placed on a mounting platform 60 in the hot plate unit so that the upward-facing surface of the wafer W is the treated surface. The wafer W is prebaked at a predetermined temperature, for example, at 100° C., for a predetermined period of time (Step 4-9). By this thermal treatment, the remaining solvent on the thin film 42 on the wafer W is vaporized and the film properties of the thin film 42 are stabilized. After the prebaking treatment, the wafer W is taken out from the hot plate unit by the main wafer-conveying mechanism (Step 4-10). Thus, the treatment is completed.

In the above-described embodiment, a device having a single resist-solution-supplying nozzle 30 is described, but a device may be provided with a plurality of resist-solution-supplying nozzles depending on circumstances. In addition, since the sprayed resist solution particles are attracted to the wafer W by electrostatic forces, the resist-solution-supplying nozzle 30 is not necessarily disposed directly below the wafer W as long as the resist-solution-supplying nozzle 30 can spray the resist solution. The resist-solution-supplying nozzle 30 may be disposed at any portion below the wafer W.

Furthermore, in the above-described embodiment, a positive potential is applied to the resist-solution-supplying nozzle 30 side, i.e., to the resist solution, but positive potential may be applied to the wafer W side. In addition, grounding may be connected to either the wafer W or the resist-solution-supplying nozzle 30.

Additionally, the resist solution particles may be separately applied with a potential which is higher than that applied to the resist-solution-supplying nozzle 30. Furthermore, a control grid applied with a potential may be provided at a position prior to the resist-solution-supplying nozzle 30 position for accelerating or decelerating the resist solution particles, if necessary.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A film-forming device used for forming a thin film on a surface of a substrate by supplying a coating solution to the substrate having asperities on the surface thereof, the film-forming device comprising:
    a treatment chamber for receiving a substrate and isolating the substrate from the air;
    a solvent-gas-supplying portion for supplying a solvent gas into the treatment chamber;
    a holding portion for rotatably holding the substrate so that the downward-facing surface of the substrate is the surface to which the thin film is formed, the holding portion being provided in the treatment chamber;

a coating-solution-supplying portion for supplying a coating solution as a mist of charged particles upward toward the surface of the substrate by spraying the particles in a direction oblique to the downward-facing substrate surface, the coating-solution-supplying portion being disposed in the treatment chamber;

a charging portion for charging the substrate with an electrical potential opposite to the charge of the particles; and a lifting and holding section for adjusting a relative distance between the substrate held by the holding portion and the coating-solution-supply portion, said relative distance preventing sprayed particles having a size greater than a predetermined particle size from contacting the downward-facing surface of the substrate due to gravity, whereby only those sprayed particles having particle sizes less than the predetermined particle size electrostatically adhere to the surface of the substrate.

2. The film-forming device according to claim 1, the device further comprising an exhausting portion for exhausting the solvent gas from the treatment chamber.

3. The film-forming device according to claim 1, wherein one of or both the holding portion and the coating-solution-supplying portion are constituted so that the relative distance between the holding portion and the coating-solution-supplying portion can be changed.

4. The film-forming device according to claim 1, wherein the lifting and holding section moves the substrate in a vertical direction so as to adjust the relative distance between the substrate and the coating-solution-supply portion.

* * * * *